(12) United States Patent
Clingman et al.

(10) Patent No.: US 7,521,841 B2
(45) Date of Patent: Apr. 21, 2009

(54) STRAIN ENERGY SHUTTLE APPARATUS AND METHOD FOR VIBRATION ENERGY HARVESTING

(75) Inventors: Dan J. Clingman, Auburn, WA (US); Robert T. Ruggeri, Kirkland, WA (US)

(73) Assignee: The Boeing Company, Chicago, IL (US)

( * ) Notice: Subject to any disclaimer, the term of this patent is extended or adjusted under 35 U.S.C. 154(b) by 171 days.

(21) Appl. No.: 11/344,823

(22) Filed: Feb. 1, 2006

(65) Prior Publication Data

US 2006/0175937 A1 Aug. 10, 2006

Related U.S. Application Data

(60) Provisional application No. 60/491,122, filed on Jul. 30, 2003.

(51) Int. Cl.
*H01L 41/113* (2006.01)
(52) U.S. Cl. ........................................ 310/339; 310/355
(58) Field of Classification Search ................ 310/329, 310/339, 330–332, 355
See application file for complete search history.

(56) References Cited

U.S. PATENT DOCUMENTS

| 4,598,587 | A | * | 7/1986 | Dwyer et al. ............. 73/514.13 |
| 6,236,143 | B1 | | 5/2001 | Lesieutre et al. |
| 6,812,624 | B1 | * | 11/2004 | Pei et al. ..................... 310/309 |
| 7,005,778 | B2 | | 2/2006 | Pistor |

FOREIGN PATENT DOCUMENTS

JP 2000-233157 8/2000
WO WO 02/086981 10/2002

OTHER PUBLICATIONS

Machine translation of JP 2000-233157.*
Post-Buckled Precompressed (PBP) Actuators: Enhancing VTOL Autonomous High Speed MAVs by Ron Barrett; 46th AIAA/ASME/ASCE/AHS/ASC Structures, Structural Dynamics & Materials Conference Apr. 18-21, 2005, Austin. Texas.

(Continued)

*Primary Examiner*—Darren Schuberg
*Assistant Examiner*—Derek J Rosenau
(74) *Attorney, Agent, or Firm*—Harness, Dickey & Pierce, P.L.C.

(57) ABSTRACT

An apparatus for use in low frequency vibration energy harvesting (VEH) and with actuators requiring a low deflection force. The apparatus includes a piezo flexure that is loaded with a compressive pre-load force to place the piezo flexure under compression. The piezo flexure may be supported at an intermediate point or at one end thereof. The compressive pre-load force produces flexes the piezo flexure into one or the other of two stable positions, these positions being offset on opposite sides of a longitudinal centerline representing the position of the piezo flexure that would be produced without the compressive pre-load force applied thereto. The compressive pre-load effectively provides a negative spring constant which "softens" the piezo flexure and enhances a responsiveness of the piezo flexure to low frequency vibration energy. The piezo flexure also operates over a much wider frequency bandwidth than conventional systems incorporating a tip mass.

10 Claims, 2 Drawing Sheets

OTHER PUBLICATIONS

Active Structures Using Buckling Beam Actuators by Eric M. Mockensturm; Jie Jiang; 44th AIAA/ASME/ASCE/AHS Structures, Structural Dynamics, and Materials Conference; Apr. 7-10, 2003, Norfolk, Virginia.

Improvement of actuation displacement of Lipca implementing bifurcation phenomena by Quoc Viet Nguyen, Seungsik Lee, Hoon Cheol Park; Smart Structures and Materials 2006; Active Materials; Behavior and Mechanics, edited by William D. Armstrong, Proc. of SPIE vol. 6170, 6170L, (2006).

"Can a Coupling Coefficient of a Piezoelectric Device Be Higher Than Those of Its Active Materials?" by George A Lesieutre and Christopher L. Davis; reprinted from Journal of Intelligent Material Systems and Structures, vol. 8-Oct. 1997.

A Centrally-Clamped Parallel-Beam Bistable MEMS Mechanism by Jin Qiu, Jeffrey H. Lang, Alexander H. Slocum; 0-7803-5998-4/1/$10.00@2001IEEE.

A Curved-Beam Bistable Mechanism by Jin Qiu, Jeffrey H. Lang, Alexander H. Slocum; 1057-7157/04$20.00 copyright 2004IEEE.

* cited by examiner

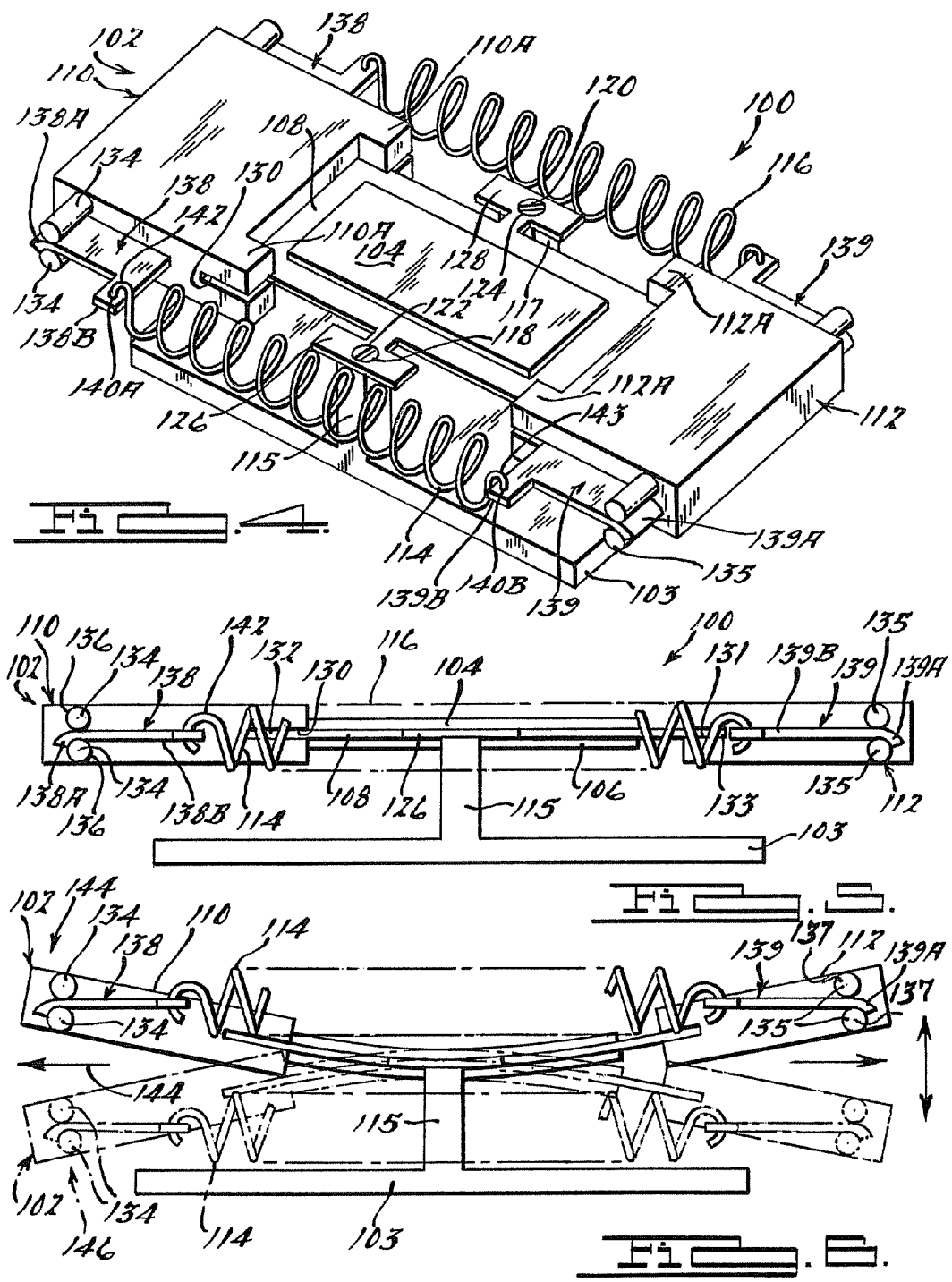

STRAIN ENERGY SHUTTLE APPARATUS AND METHOD FOR VIBRATION ENERGY HARVESTING

CROSS-REFERENCE TO RELATED APPLICATIONS

This application is a continuation of International Patent Application Ser. No. PCT/US/2004/025049 filed Jul. 30, 2004, which in turn claims priority from U.S. Patent Provisional Application No. 60/491,122 filed Jul. 30, 2003, the disclosures of which are incorporated herein by reference.

FIELD OF THE INVENTION

This invention relates to vibration energy harvesting devices, and more particularly to an apparatus which is ideally suited for harvesting low frequency vibration energy from a vibrating structure.

BACKGROUND OF THE INVENTION

Many environments offer a vibration rich environment that is ideal for harvesting vibration energy. Such environments often exist in aircraft and automotive applications where the vibration experienced by an aircraft or automotive vehicle represents energy that could be used to power sensors or other remotely located devices, provided such energy can be harvested by a suitable device.

Vibration energy harvesting (VEH) can be accomplished by developing relative motion, and hence energy, between a vibrating structure and a reaction mass coupled to the structure. This mechanical energy can be converted into electrical energy by developing cyclic stress in a piezo electric structure. A simple form of this device is a cantilever beam that has piezo material attached to the surface. This is illustrated in FIG. 1. A reaction mass is attached to the tip of the beam to increase performance. When subjected to vibration, the tip of the beam tends to resist motion, thus placing the piezo material under stress. This stress results in electrical charge accumulation in the piezo material that results in an increase in voltage potential between two points of the material. However, for this topology to work efficiently, vibration energy must occur at or above the beam resonance frequency. Vibration energy with frequency content below the resonance frequency will produce very little motion between the tip mass and the base.

When the cantilever beam shown in FIG. 1 is used, the stiffness of the beam, including the piezo material, beam length (L) and the tip mass determine the lowest frequency where the VEH device will work. Additionally, piezo material is usually a ceramic and is fragile when subjected to tension loading which will limit the robustness of the VEH device and its life. FIG. 2 illustrates the relative tip displacement as a function of frequency for this device. At low frequency, the tip beam moves very little relative to the vibrating structure. Accordingly, the VEH device shown in FIG. 1, at low frequency, will provide very little power from low frequency vibrations. Vibration energy at resonance frequency will provide maximum VEH, but utility is limited by a very narrow bandwidth.

The limitation of needing to "tune" the system around the resonant frequency of the cantilever beam imposes a significant limitation in terms of efficient operation of the system shown in FIG. 1. This is because various structures often produce vibration energy over a much wider frequency bandwidth than what the system can be tuned for. The selection of the tip mass, to essentially tune the system to operate efficiently at the resonant beam frequency, means that the system will not be efficient in harvesting energy at other frequencies above and below the resonant frequency of the cantilever beam. Accordingly, a system that is not limited to efficient harvesting of vibration energy at only the resonant beam frequency, but that is able to harvest energy over a relatively wide frequency range, would be much more effective in generating electrical power from a vibrating structure.

Accordingly, there still exists a need for an apparatus able to be used with a piezo material to improve the harvesting of vibration energy at low frequencies, and also at frequencies above and below the resonant frequency of the structure from which vibration energy is being harvested. Such an apparatus would be extremely useful for powering remotely located sensors and various other components from low frequency vibration energy experienced by a piezo, beam-like structure. Such an apparatus would effectively make it possible to provide energy harvesting from a wide variety of structures experiencing low frequency vibration where such energy harvesting would have previously not been practicable.

SUMMARY OF THE INVENTION

The present invention is directed to a strain energy shuttle apparatus and method. The apparatus of the present invention is useful for providing low frequency vibration energy harvesting (VEH) from a piezo beam-like structure experiencing low frequency vibration energy. In one preferred form the apparatus includes a biasing element for mechanically generating a negative spring force that is added in parallel with a piezo flexure (i.e., a piezo beam-like component). The negative spring force provided by the biasing element effectively "softens" the piezo flexure and provides the piezo flexure with substantially a zero stiffness at zero frequency. The apparatus provides important benefits for applications where softening of a piezo structure is desirable, such as where the piezo structure is being used to harvest low frequency vibration energy or as an actuator to move a separate component. In either application, the apparatus of the present invention operates to overcome the inherent structural stiffness of the piezo flexure to allow much easier flexing thereof.

In one preferred embodiment the biasing element is coupled to a cantilever beam which is in turn pivotally coupled to a supporting structure. The piezo flexure is also coupled to the structure in a manner that places the piezo flexure generally in a common plane with the biasing element. A flexure couples a free end of the piezo flexure to a free end of the biasing element. This produces two stable positions, each being laterally offset from a line extending from the point of attachment of the piezo flexure to its associated structure and the point of attachment of the cantilever beam to the structure. Precise tailoring of the force provided by the biasing element enables the piezo flexure to be moved very easily by low frequency vibration energy from one of the two stable positions to the other and back again. Once moved from one stable position to the other, the piezo flexure will oscillate around the new stable position, thereby generating additional power.

In another preferred embodiment, an apparatus is disclosed that makes use of a piezo flexure having a support substrate with at least one piezoceramic wafer secured thereon. The support substrate is supported at an intermediate point of its length. A biasing element is operatively associated with the support substrate to apply a compressive force to the substrate sufficient to deflect the substrate and the piezoceramic wafer mounted thereon into one of two stable positions on opposite sides of a centerline that extends through the substrate when it is not being subjected to a compressive pre-stress force. The compressive force provided by the biasing element serves to "soften" the inherent structural stiffness of the piezoceramic wafer and enhance its responsiveness to vibration energy, and particularly to low frequency vibration energy.

In one preferred form a plurality of biasing elements are disposed longitudinally parallel to and along a longitudinal axis of the support substrate on opposite sides of the piezoceramic wafer. The support substrate is also supported at an approximate mid-point thereof on a base assembly that experiences the vibration energy. Opposite ends of the support substrate are secured to link arms, with each of the biasing elements being attached between the link arms on opposite longitudinal sides of the support substrate. This arrangement imparts a compressive stress to the piezoceramic wafer that softens the wafer and deflects the opposite ends of the wafer into one of two stable positions. Most importantly, the compressive force significantly enhances the response of the piezo electric material to low frequency vibration energy.

The present invention thus significantly assists in overcoming the inherent structural stiffness of a piezo flexure. The apparatus makes the piezo flexure highly susceptible to very low frequency vibration energy which would otherwise not be sufficient to cause sufficient flexing or bending of the piezo flexure for low frequency vibration energy harvesting applications. A significant advantage of the present invention is that vibration energy harvesting can be accomplished over a significantly wider frequency bandwidth than what is possible with conventional cantilever beam VEH devices using a tip mass.

Further areas of applicability of the present invention will become apparent from the detailed description provided hereinafter. It should be understood that the detailed description and specific examples are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4 is a perspective view of an alternative preferred embodiment of the present invention, making use of a pair of apparent biasing elements to soften the piezoelectric flexure of the assembly; and FIG. 5 is a side view of the assembly of FIG. 4; and FIG. 6 is a side view of the assembly of FIG. 4 illustrating the two stable positions.

DETAILED DESCRIPTION OF THE PREFERRED EMBODIMENTS

The following description of the preferred embodiment(s) is merely exemplary in nature and is in no way intended to limit the invention, its application, or uses.

Figure 3:
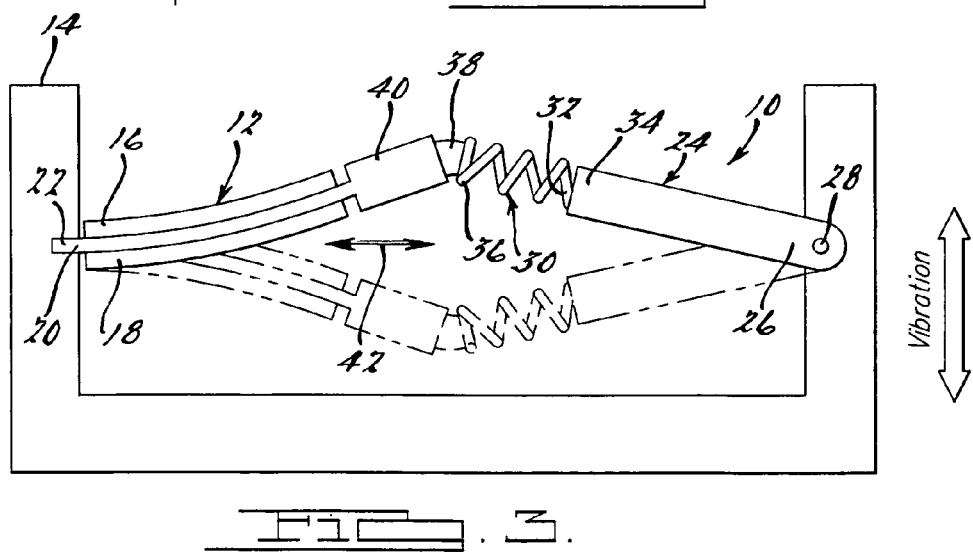
FIG. 3 is a view of a preferred embodiment of the present invention incorporated for use with a piezo flexure.

Referring to FIG. 3, an apparatus 10 in accordance with a preferred embodiment of the present invention is shown. The apparatus is used for enabling low frequency vibration energy harvesting (VEH) through the use of a piezo flexure 12 which is supported fixedly from a vibrating structure 14. The piezo flexure essentially forms a beam-like structure, and in one preferred form comprises a piezo bimorph flexure. The piezo flexure 12 includes piezo layers 16 and 18 formed on opposite sides of a flexible supporting substrate 20. The substrate 20 includes an end 22 which is fixedly coupled to the structure 14. The substrate 20 can be plastic, metal or any other flexible material that allows the piezo layers 16 and 18 to be bonded thereto.

The apparatus 10 further includes a link or cantilever beam 24 which is pivotally coupled at a first end 26 via a pivot pin 28 or other suitable coupling element such that the beam 24 is able to pivot about pin 28 in response to vibration experienced by the structure 14. A biasing element 30 is fixedly coupled at one end 32 to a free end 34 of the beam 24 and at an opposite end 36 to a flexure 38. The flexure 38 is in turn coupled to a free end 40 of the piezo flexure 12. Flexure 38 may comprise any suitable coupling element or material which enables relative movement between the end 36 of the biasing element 30 and the free end 40 of the piezo flexure 12. In one preferred form the biasing element 30 comprises a compression coil spring, but it will be appreciated that any biasing element capable of providing a force directed against the piezo flexure 12 could be incorporated.

The coupling of the cantilever beam 24 to the free end 40 of the piezo flexure 12 (via the biasing element 30) produces an arrangement wherein the piezo flexure 12 has two stable positions, with one being shown in solid lines in FIG. 3 and the other being indicated in phantom. Each of the stable positions of the piezo flexure 12 are laterally offset from a longitudinal mid line 42 extending between the point of attachment of the fixed end 22 of the piezo flexure 12 and the pivot pin 28 supporting the cantilever beam 24. The mid-line 42 can be viewed as a position of equilibrium, albeit an unstable one. This geometry essentially produces a geometric cotangent function between the piezo flexure 12 and the biasing element 30. In effect, the piezo flexure 12 experiences a spring constant that is the negative of the spring constant provided by biasing element 30.

The apparatus 10 significantly reduces the force required to move the piezo flexure 12 between the two stable positions shown in FIG. 3. Put differently, the biasing element 30 and cantilever beam 24 operate to significantly "soften" the piezo layers 16 and 18 to overcome the inherent structural stiffness of each. By tailoring the spring constants of the biasing element 30 and the piezo flexure 12, the energy required to switch conditions and cause movement of the piezo flexure 12 out of one stable position and into the other stable position can be matched to the electrical load which the piezo flexure 12 is electrically coupled to. When properly matched, the apparatus 10 is highly efficient. Under such a condition, the energy delivered to the electrical load is equal to the stress-strain hysteresis observed in the piezo flexure 12.

Figure 1:
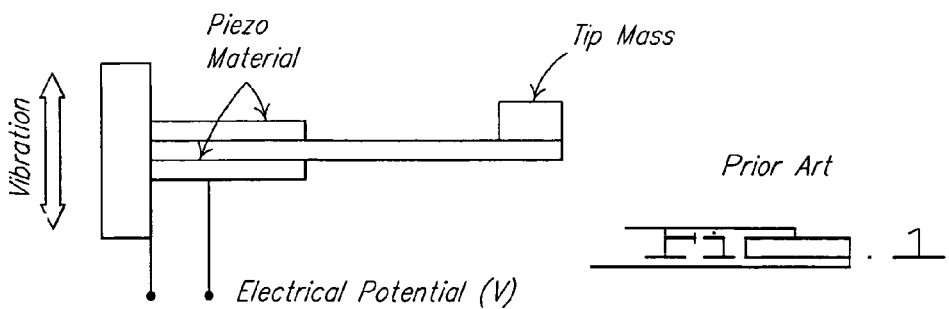
FIG. 1 is a view of a prior art energy harvesting device incorporating a conventional tip mass disposed at a free end of a piezo beam-like structure.
Figure 2:
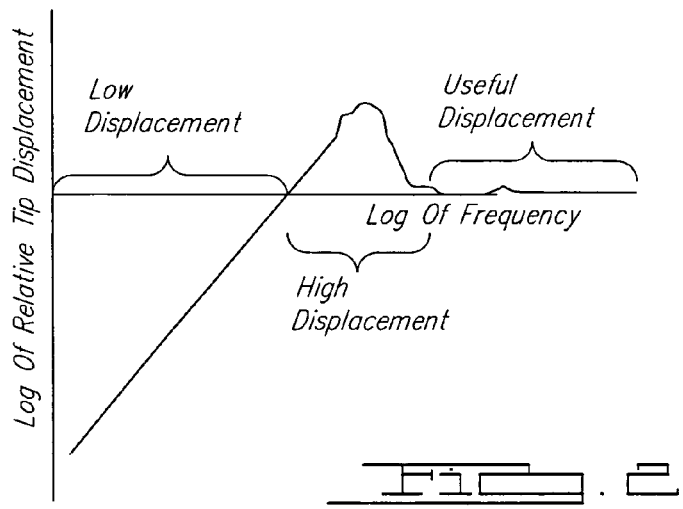
FIG. 2 is a graph of the tip displacement of the beam shown in FIG. 1 relative to frequency.

The apparatus 10 has a significantly lower frequency of operation than a conventional energy harvesting device, such as that shown in FIG. 1. The frequency of operation of the apparatus 10 is determined in part by the stiffness of the piezo flexure 12 and the mass of the piezo flexure. The relationship between the angular tip deflection (i.e., of tip 38) of the piezo flexure 12 and an applied torque is given by equation 1 below:

$$T_{PiezoFlexure} = \theta_{PiezoFlexure} * K_{PiezoFlexure} \quad \text{Equation 1}$$

$$T_{PiezoFlexure} = \alpha_{PiezoFlexure} * K_{PiezoFlexure}$$

The biasing element 30 (i.e., compression spring) applies a non-linear torque to the piezo flexure 12 which is represented by equation 2 below:

$$T_{PiezoFlexure/Spring} = L * F_{Spring} * \sin(\theta_{PiezoFlexure})  \quad \text{Equation 2}$$

The torque applied to the piezo flexure 12 deforms the piezo flexure 12 to an angle whereat the piezo flexure 12 is stable at two locations as shown in FIG. 3. The torque required to change the state of the piezo flexure 12 from +θ to −θ is the difference between the torque generated by the biasing element in equation 1 and the torque given in equation 2, and is represented by the following Equation 3:

$$T_{Tot} = T_{PiezoFlexure} - T_{PiezoFlexure/Spring} = \theta_{PiexoFlexure} * K_{PiezoFlexure} - L * \sin(\theta_{PiexoFlexure}) (F_{max} - 2*L*(1 - \cos t(\theta_{PiexoFlexure}))) * K_{spring}$$

The difference in torque is the effective "softening" of the piezo flexure 12. Equation 4 represents the deflection of the biasing element 30 (i.e., the spring) as a function of piezo flexure angle θ:

$$\delta_{spring} = 2*L(1 - \cos t(\theta_{PiezoFlexure})) \quad \text{Equation 4}$$

Equation 5 defines the maximum spring force $F_{max}$:

$$F_{max} = [F_{Spring}]\theta = 0$$

Also, a compression spring exhibits a force-distance relationship expressed by equation 6:

$$F_{Spring} = -K_{spring} * \delta_{spring} + F_{max}$$

This relationship, when applied to the apparatus 10, results in two stable angles. The torque necessary to change the positions is a strong function of the spring constant, where a softer spring produces a lower reset force (i.e., a force required to move the piezo flexure 12 from one stable position to the other). Equation 3, above, clearly shows the non-linear nature of the torque versus θ relationship.

An additional advantage of the apparatus 10 is that the two stable positions produce a frequency conversion between low frequency vibration and the high frequency nature of the stable angle locations. Put differently, once external vibration energy has caused the piezo flexure 12 to move from one stable position to the other, the piezo flexure 12 will oscillate around the stable location that it has just moved to, allowing the piezo material 16 and 18 of the piezo flexure 12 to harvest the strain energy over many cycles.

While the apparatus 10 has been described in connection with "softening" a piezo flexure for vibration energy harvesting applications, it will also be appreciated that the apparatus 10 can be readily incorporated in an actuator. For example, the apparatus 10 is extremely well suited to applications requiring large deflections of the piezo flexure and low force, such as with an aerodynamic flow control synthetic jet actuator or a low frequency audio speaker. In this embodiment the apparatus 10 is designed such that the torque required to change the state of the apparatus 10 is within the capability of the piezo material to provide torque. Applying a voltage to the piezo materials 16 and 18 on the piezo flexure 12 causes the apparatus 10 to change states producing significantly larger displacements than would occur if the piezo flexure was energized without the biasing element 30. Typical increases in motion of the piezo flexure 12 with the present invention can be ten to twenty times that obtained with a simple, conventional piezo flexure unassisted by any spring force.

It will also be appreciated that for both energy harvesting and actuation applications, the use of other materials besides piezo electric materials is possible. For example, electromagnetic, electrostatic and magnostictive transduction technology can be used.

Referring to FIGS. 4 and 5, a VEH apparatus 100 is illustrated in accordance with another preferred embodiment of the present invention. VEH apparatus 100 generally comprises a piezo flexure assembly 102 supported on a base 103. The flexure assembly 102 includes a pair of piezoelectric wafers 104 and 106 disposed on opposite sides of a support substrate 108. In one preferred form the piezoelectric wafers 104, 106 each comprise piezoceramic wafers. The flexure assembly 102 further includes a pair of link arms 110 and 112 and a pair of biasing elements 114 and 116 coupled between the link arms 110, 112.

The entire flexure assembly 102 is supported on the base 103 from a pair of upstanding boss portions 115 and 117. Conventional threaded fasteners 118 and 120 extend through openings 122, and 124 in support arms 126 and 128 of the support substrate 108 to thus suspend the entire flexure assembly 102 above the base 103. The support arms 126 and 128 are located at an approximate midpoint of the support substrate 108, but the support arms could also be offset so as to be closer to one or the other of the link arms 110, 112 and thus not disposed at the approximate longitudinal midpoint. The substrate 108 can be made of spring steel, beryllium copper, brass, glass epoxy composite or graphite epoxy composite, or any other suitable material.

With specific reference to FIG. 5, the attachment of the biasing element 114 to each link arm 110 and 112 can be seen in greater detail. The same arrangement is used to couple the opposite ends of biasing element 116 to the link arms 110 and 112. Each link arm 110 and 112 includes a slot 130, 131 formed along a portion of its length. Each slot 130, 131 is further disposed along a midpoint of the overall thickness of its respective link arm 110 or 112. Slot 130 has a height sufficient to receive an end 132 of the support substrate 108 therein. Slot 131 similarly is sized to receive end 133 of the support substrate 108. Ends 132 and 133 are each adhered or otherwise secured in their respective slots 130 or 131 such that they are not removable from either link arm 110 or 112.

The link arm 110 further includes a pair of pins 134 that extend through spaced apart openings 136 in the link arm 110. Link arm 112 similarly includes a pair of pins 135 that extend through openings 137 in link arm 112. The pins 134 essentially form a channel through which one end 138A of a flexure component 138 can be secured. Pins 135 similarly form a channel for securing an end 139A of a second flexure component 139. End 138A of the flexure component has a cross-sectional thickness that is greater than an end 138B so that end 138A cannot simply be pulled out from between the pins 134. End 139A of flexure component 139 is constructed in identical fashion with a thickness greater than end 139B so that it cannot be removed from between pins 135. However, this coupling arrangement allows free pivoting movement of ends 138A and 139A about their respective pins 134 and 135 with a minimal degree of friction and while limiting stress at this area of its associated flexure component 138 or 139.

Referring further to FIGS. 4 and 5, each end 138B, 139B of the flexure components 138 and 139 include a opening 140A, 140B which receives an end 142, 143 of the biasing element 114. In practice, any suitable means for attaching the ends. 142, 143 of biasing element 114 can be employed. Biasing element 116 is coupled in the same fashion. The link arms 110 and 112 may be made from a variety of materials but preferably are comprised of aluminum, steel, glass or graphite epoxy. Biasing element 114 is illustrated as a coil spring, but in practice any form of spring that is coupled between the link arms 110 and 112 that serves to place the piezoelectric wafers 104 and 106 in compression may be employed.

With further specific reference to FIG. 4, link arm 110 includes a notch forming ears 110A, while link arm 112 similarly includes a notch forming ears 112A. The ears 110A and 112A provide stress transition regions that maintain stiffness across those areas where the opposite ends of the support substrate 108 are coupled to their respective link arms 110, 112. The gap formed between each link arm 110 and 112 and the adjacent ends of the piezoceramic wafers 104, 106, produces a low bending stiffness region along the flexure 102 that would otherwise reduce performance of the apparatus 100. The ears 110A and 112A of each link arm 110 and 112, respectively, thus provide increased bending stiffness to offset this.

With further reference to FIG. 5, each of the piezoelectric wafers 104, 106 may vary significantly in thickness, length and width to suit the needs of a particular application. However, in one preferred form, each piezoelectric wafer 104 and 106 has a thickness of about 0.005"-0.02" (0.127 mm-0.508 mm). In one preferred form, the length and width of the piezoelectric wafers 104 and 106 is about 1.8" (45.72 mm) and about 0.6" (15.24 mm) respectively. The actual energy per bending cycle generated by the apparatus 100 is a function of piezoceramic volume that is under stress. A thicker piezoceramic wafer will provide a higher energy content, but this energy will be in the form of high voltage and low charge as compared to a thinner material. Although more energy is available from thicker piezoceramic material, the conversion electronics that are needed to capture this energy are significantly more complex and less efficient than that required for use with a thinner piezoceramic wafer. Thinner piezoceramic material produces a lower voltage but much higher charge. Merely as an example, typical capacitance and voltages produced by a piezoceramic wafer, per cycle of oscillation, are as follows:

0.02" thick PZT 5A-10 nF at 200 volts (harder to convert);
  0.005" thick PZT 5A-100 nF at 30 volts (easily converted);
  Total energy is $CV^2/2$ per bending cycle.

Referring to FIG. 6, the oscillating motion of the flexure assembly 102 can be seen in response to a vibration force. The compressive force generated by the biasing elements 114, 116 is sufficient to maintain the flexure assembly 102 in a deflected (i.e., bowed) orientation at one of two stable positions 144 or 146. Longitudinal line 148 represents the plane the flexure assembly 102 would reside in without the compressive force from the biasing elements 114, 116. When in either of positions 144 or 146, the flexure assembly 102 is highly responsive to low frequency vibration energy and is easily deflected to the other stable position by such energy. The spring force provided by the biasing elements can be tailored to provide the required sensitivity for a specific VEH application.

The present invention thus forms a means to significantly "soften" a piezo flexure which enables the piezo flexure to be used in low frequency vibration energy harvesting applications where such a flexure would otherwise be too structurally stiff to harvest the vibration energy. A significant benefit of the present invention is that it can be used over a wider frequency bandwidth than previously developed VEH devices incorporating a tip mass on the free end of the piezo flexure. The capability of operating over a wider bandwidth allows the invention 10 to more efficiently harvest vibration energy from the structure and to generate a greater voltage output from the vibration energy than would be possible with a conventional piezo flexure.

While various preferred embodiments have been described, those skilled in the art will recognize modifications or variations which might be made without departing from the inventive concept. The examples illustrate the invention and are not intended to limit it. Therefore, the description and claims should be interpreted liberally with only such limitation as is necessary in view of the pertinent prior art.

What is claimed is:

1. An energy harvesting apparatus comprising:
   a support substrate;
   a piezoelectric wafer secured to a surface of said support substrate;
   a base for supporting said support substrate in a manner to enable oscillating motion of said support substrate and said piezoelectric wafer;
   said base including a frame for supporting said support substrate from an approximate midpoint thereof; and
   a pair of biasing elements operatively associated with opposite longitudinal ends of said support substrate, and disposed on opposite lateral sides of said support substrate, and generally longitudinally aligned with a plane of said midpoint of said support substrate, for supplying a mechanical compressive pre-load force to said piezoelectric wafer and said support substrate that is sufficient to deflect outer ends of said support substrate into one of two flexed orientations that are laterally offset from said plane of said midpoint of said support structure, in the absence of vibration energy, to thus soften said piezoelectric wafer to facilitate oscillating motion of said wafer in response to vibration experienced by said base.

2. The apparatus of claim 1, wherein said frame including a boss portion for supporting said support substrate from said approximate midpoint thereof.

3. The apparatus of claim 1, further comprising a pair of link arms coupled to opposite longitudinal ends of said support substrate; and
   wherein said biasing elements are each coupled between said link arms.

4. The apparatus of claim 1, further comprising a pair of said piezoelectric wafers secured to opposing surfaces of said support substrate.

5. The apparatus of claim 3, wherein said pair of said biasing elements are disposed parallel to said support substrate and each coupled at opposite ends thereof to portions of said link arms.

6. The apparatus of claim 1, wherein each said biasing element comprises a coil spring.

7. The apparatus of claim 1, wherein said piezoelectric wafer comprises a piezoelectric ceramic wafer.

8. A method for vibration energy harvesting, comprising:
   disposing a piezoelectric wafer on a support substrate;
   supporting said support substrate from a midpoint thereof to enable oscillating motion of a pair of outer ends of said support substrate;
   arranging a pair of biasing elements generally parallel to said support substrate on opposite lateral sides of said support substrate, and securing opposite ends of each of said biasing elements to said outer ends of said support structure, such that said biasing elements apply a compressive stress to said support substrate that is sufficient to deflect said outer ends of said support substrate, and thus said piezoelectric wafer, from a central, non-flexed position, into one of two flexed positions laterally spaced apart from midpoint, said compressive stress operating to soften said piezoelectric wafer to enhance a response of said wafer to vibration energy.

9. The method of claim 8, further comprising securing said support surface in a manner to enable oscillating motion of opposite longitudinal ends of said piezoelectric wafer.

10. A method for forming an actuator using a piezoelectric wafer, comprising:
supporting the piezoelectric wafer on a support substrate to enable motion of said piezoelectric wafer;
supporting said support substrate from a midpoint thereof such that outer longitudinal ends thereof are free to move; and
using a pair of biasing elements disposed on opposite lateral sides of said support substrate and longitudinally aligned with a midpoint of said support substrate, and operatively coupled to said outer ends of said support substrate, to place said support substrate and said piezoelectric wafer under a compressive pre-load stress sufficient to hold said piezoelectric wafer in one of two stable flexed, non-linear configurations, said compressive pre-load operating to soften said wafer and enhance motion of said outer ends of said support substrate to enhance a sensitivity of said piezoelectric wafer.

* * * * *